United States Patent [19]
Woolf et al.

[11] Patent Number: 5,123,586
[45] Date of Patent: Jun. 23, 1992

[54] PROCESS FOR SOLDERING SUPERCONDUCTING FIBERS INTO A COPPER CHANNEL

[75] Inventors: Lawrence D. Woolf, Carlsbad; Clyde H. Shearer, Santee; Frederick H. Elsner, Cardiff, all of Calif.

[73] Assignee: General Atomics, San Diego, Calif.

[21] Appl. No.: 586,768

[22] Filed: Sep. 21, 1990

[51] Int. Cl.$^5$ .......................... B23K 1/00; B23K 1/19; B23K 103/16

[52] U.S. Cl. .................................. 228/124; 228/223; 228/248; 505/927

[58] Field of Search ................ 228/122, 124, 190, 207, 228/233, 248, 263.12; 505/925, 927

[56] References Cited

U.S. PATENT DOCUMENTS

| | | | |
|---|---|---|---|
| 3,507,038 | 4/1970 | Moll et al. | 228/110 |
| 3,616,530 | 11/1971 | Chester | 505/927 |
| 3,737,989 | 6/1973 | Schaetti | 505/927 |
| 4,161,062 | 7/1979 | Agatsuma et al. | 505/927 |

FOREIGN PATENT DOCUMENTS

| | | | |
|---|---|---|---|
| 54-157497 | 12/1979 | Japan | 505/927 |
| 6232022 | 2/1981 | Japan | 505/927 |
| 700024 | 12/1983 | U.S.S.R. | 505/927 |
| 2004489 | 4/1979 | United Kingdom | 228/248 |

OTHER PUBLICATIONS

Shimamoto et al, "Making and Testing of Multifilimentary Nb$_3$Sn . . . ", 6th International Conference on Magnetic Technology, pp. 1002-1006, 1977.

Hamilton et al, "Manufacture of a 16,000 Amp Superconducting Conductor . . . ", 9th Symposium on Engineering Problems of Fusion Research, pp. 324-327, 1981.

Metals Handbook, Ninth Edition, vol. 6, pp. 1100, 1101, 1983.

*Primary Examiner*—Samuel M. Heinrich
*Attorney, Agent, or Firm*—Nydegger & Associates

[57] ABSTRACT

A process for joining ceramic superconductor fibers with a channel to fabricate a superconductor wire includes feeding the fibers into the channel and continuously dispensing a flowable solder paste into the channel over the fibers. The combination of channel, fibers and solder paste is then subjected to a rapid rise in temperature which sequentially activates the flux in the solder paste and then melts the solder. After the workpiece is cooled and the separated flux has been removed, a superconductor wire has been fabricated.

24 Claims, 2 Drawing Sheets

PROCESS FOR SOLDERING SUPERCONDUCTING FIBERS INTO A COPPER CHANNEL

FIELD OF THE INVENTION

The present invention pertains generally to superconductor wires. More specifically, the present invention pertains to processes for manufacturing multifilament superconductor wires. The present invention is particularly, but not exclusively, useful for joining superconductor fibers to a copper channel substrate in order to fabricate multifilament superconductor wires.

BACKGROUND OF THE INVENTION

In order to meet our increasing demands for electrical energy, the need for effective electrical transmission lines is obvious. Indeed, the fact that electricity can be used for a wide variety of applications is well recognized and innumerable examples can be given wherein electricity makes possible many of the activities in our daily lives which would otherwise be impossible. Furthermore, any advancements in the electrical arts have accumulative effect on our demands for electricity. Consequently, more effective means for transmitting electrical energy are constantly being sought. It happens that particularly promising advancements in the electrical arts are now being actively pursued in the field of superconductors.

The use of superconductors for the manufacture of electrical wires or cables and for long electrical transmission lines raises many technical issues which stem from the fact that superconductor materials are inherently difficult to manufacture and difficult to handle. For instance, the popularly so-called 1-2-3 superconductor is operationally effective in a ceramic form. Ceramics, however, are extremely brittle and are not able to withstand much, if any, stress in tension. Moreover, although ceramics can withstand some stress in compression, even this capacity is minimal. Ceramic superconductors are, unfortunately, no exception. Consequently, if improperly handled, ceramic superconductors can be easily damaged. Typically, mechanical damage to a ceramic superconductor is manifested as cracks and breaks in the ceramic that have serious adverse consequences on the ability of the superconductor to be a superconductor. The answer to this problem is, of course, to effectively protect the ceramic superconductor with a properly supporting substrate during its operative application. Equally important, the ceramic superconductor must not be damaged during the process in which it is joined to the supporting substrate.

To address the problem of how to join a ceramic superconductor to a supporting substrate, some well-known phenomenon are helpful. For example, it is well-known that a solid structure can be surrounded by a liquid or a semi-liquid element without physically damaging the solid structure. Subsequently, as such a liquid or semi-liquid element is properly hardened around the solid structure, the solid structure will be encased or embedded in the hardened element which was previously a liquid. Further, by simultaneously attaching or bonding the element to a substrate as the element is being hardened onto the structure, the structure itself can be effectively supported by the substrate. Where, however, the substrate is a ceramic superconductor material, this seemingly straight forward process becomes extremely complicated. Not only is there a need to address the problem of how to avoid physically damaging the fragile superconductor material, there is still the problem of how to avoid chemical damage to the structure (i.e., superconductor ceramic) during the process.

In light of the above it is an object of the present invention to provide a process for joining a ceramic superconductor filament with a protective supporting substrate without causing inoperable damage to the ceramic superconductor. Another object of the present invention is to provide a process for joining a ceramic superconductor filament with a protective supporting substrate without causing substantially adverse chemical damage to the ceramic superconductor. Still another object of the present invention is to provide a process for joining multiple ceramic superconductor filaments with a protective supporting substrate to fabricate operatively effective lengths of superconductor wire. Another object of the present invention is to provide a substrate for a superconductor element which functions as an electrical current bypass. Yet another object of the present invention is to provide a continuous process for joining a ceramic superconductor filament with a protective supporting substrate which is relatively easy to reproduce and which is comparatively cost effective to implement.

SUMMARY OF THE INVENTION

A process for joining a plurality of ceramic superconductor fibers, or filaments, with a protective supporting substrate to fabricate a superconductor wire involves soldering the superconductor fibers to the substrate. In accordance with the present invention, the substrate is formed as a U-shaped channel and the fibers are positioned in the channel. A flowable solder paste is then dispensed into the channel and the combination is heated in a prescribed manner to join the solder with both the fibers and the channel to support and hold the fibers in the channel.

Prior to being joined with the channel, additional protection for each of the superconductor fibers is preferably provided by pre-coating the fibers with a protective layer, such as silver. These coated fibers are then juxtaposed to form a layer of superconductor material which is continuously fed into the channel. For the present invention, the channel is preferably formed with a groove into which the fibers are to be positioned, and the channel is made of an electrically conducting material such as copper. Once the superconductor material is positioned in the groove of the channel, a solder paste which has flux and binder constituents is continuously dispensed into the channel to surround the fibers. In order to properly bind together the superconductor material, the solder and the channel, this combination of elements is sequentially processed in three separately discernable stages.

In the first stage, the combination of elements are preheated to remove volatile components from the solder paste. In the second stage, the combination is subjected to a rapid increase in temperature over a very short period of time. During this second stage, the flux in the solder is activated to clean all metal surfaces. Specifically, the fibers, the substrate, and the solder metal are cleaned. In the third stage, the solder metal initially melts and the flux floats to the surface of the molten solder. This minimizes potential corrosion of the superconductor fibers by contact with the active flux.

At the end of the third stage, the combination of elements then is rapidly cooled to a temperature below the melting point of the solder to minimize the corrosive effects of the molten solder metal on the superconductor fibers and then to near room temperature. The flux residue is then removed from the superconductor wire.

As a specific example of the above generally described procedure, using solder paste from Fusion, Inc. designated WC-361-801 which contains solder metal component Sn62-Pb36-Ag2, the combination of superconductor fibers, solder and U-shaped channel is heated in the first stage to approximately one hundred thirty degrees centigrade (130° C.) and maintained at this temperature until the volatile components in the solder paste have been removed. The second stage is then initiated and the combination is rapidly heated from one hundred thirty to around two hundred twenty degrees centigrade (130° C.-220° C.) at the rate of approximately fifty degrees centigrade/second (50° C./sec.). During this stage, the solder is attached to both the superconductor fibers and to the channel. Specifically, as the temperature reaches between one hundred fifty and one hundred sixty degrees centigrade (150° C. and 160° C.), the flux in the solder is activated to clean the metallic surfaces to be joined (i.e., the channel, the superconductor fibers, and the solder metal). Subsequently, as the combination reaches approximately one hundred eighty degrees centigrade (180° C.), the solder metal in the paste melts, or begins to reflow, and therefore the less dense flux rises to the top of the molten solder. Importantly, this ends physical contact of the active flux with the silver coated superconductor fibers. Finally, the solder reflow temperature of two hundred five to two hundred twenty degrees centigrade (205° C.-220° C.) is attained.

In the third stage, the combination is maintained at the solder reflow temperature for a short time and then is rapidly cooled to a temperature below the melting point of the solder. This is done in order to minimize the corrosive effect molten solder may have on the superconductor material. The now formed superconductor wire is then further cooled to room temperature and the flux residue on the surface is removed from the wire.

The novel features of this invention, as well as the invention itself, both as to its structure and its operation, will be best understood from the accompanying drawing, taken in conjunction with the accompanying description, in which similar reference characters refer to similar parts, and in which:

DESCRIPTION OF THE PREFERRED EMBODIMENT

Figure 1:
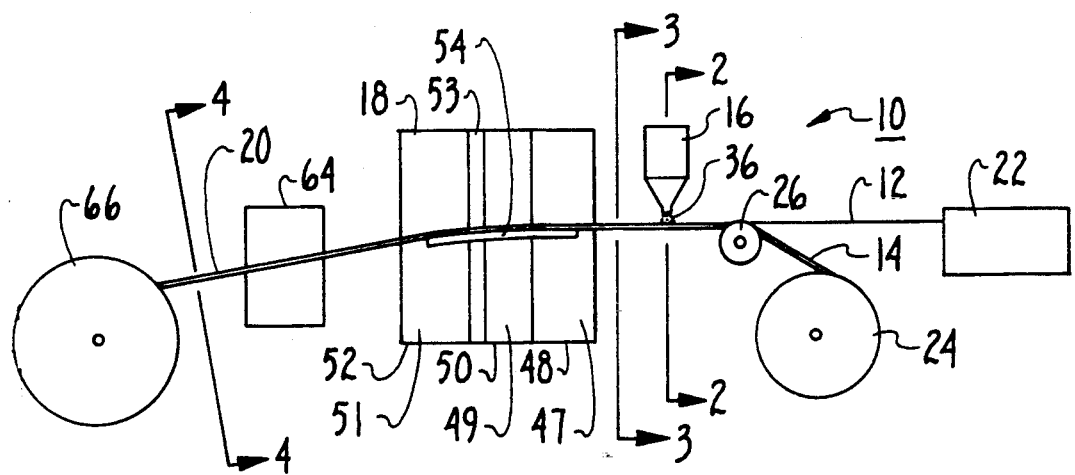
FIG. 1 is a schematic representation of the apparatus and components required for soldering ceramic superconductor fibers to a supporting substrate to fabricate a superconductor wire in accordance with the process of the present invention.

Referring initially to FIG. 1, an apparatus for manufacturing a superconductor wire is shown and generally designated 10. As shown, the apparatus 10 is intended to operatively join a plurality of superconductor fibers 12 with a protective supporting substrate, such as the channel 14. To do this, a solder paste dispenser 16 and a furnace 18 are sequentially positioned for using a solder to join the superconductor fibers 12 with the channel 14 to fabricate a superconductor wire 20.

More specifically, a combiner 22 is used for juxtaposing a plurality of prefabricated superconductor fibers 12 to form a layer of superconductor material. In accordance with the present invention any of several well-known means for juxtaposing wires may be used. Importantly, however, the means selected for juxtaposing superconductor fibers 12 into a layer should be able to do so without physically damaging the fibers 12. FIG. 1 also shows that a supply spool 24 initially holds the channel 14 component of superconductor wire 20 which is to be joined with the superconductor wires 12. A roller 26 is also provided, as shown in FIG. 1, to position channel 14 so that the superconductor fibers 12 can be properly disposed in the channel 14 as they are drawn from the combiner 22.

Figure 2:
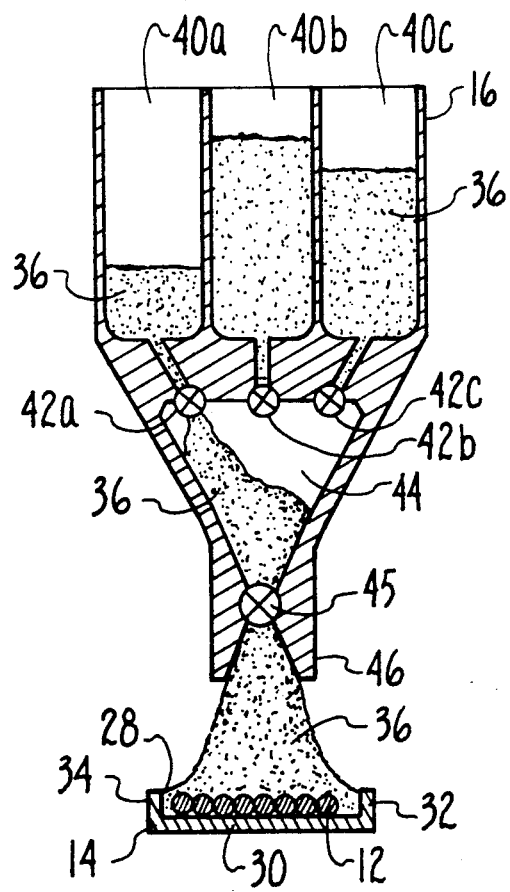
FIG. 2 is a cross-sectional view of a portion of the apparatus as seen along the line 2—2 in FIG. 1.

Referring for the moment to FIG. 2 it can be seen that channel 14 is preferably a U-shaped structure which is formed with a groove 28. Specifically, the groove 28 of channel 14 is bounded by the floor 30 of channel 14 and a pair of substantially parallel sidewalls 32, 34 which extend perpendicularly from the floor 30. Further, the channel 14 is preferably made of an electrically conducting metal, such as copper. With this structure for channel 14, it is preferable for the juxtaposed superconductor fibers 12 to be positioned in the groove 28 of channel 14 with the fibers 12 resting on floor 30 of the channel 14 substantially as shown in FIGS. 2, 3, and 4.

Returning now to FIG. 1, it will be seen that with the superconductor fibers 12 positioned in groove 28 of channel 30, the combination is passed under the solder paste dispenser 16 where groove 28 is filled with a solder paste 36. Preferably solder paste 36 is of a type which is commercially available and which has a metal solder content indicated by the formulation Sn62-Pb36-Ag2. This composition is known in the art to minimize leaching of silver when soldering silver coated parts. Also, this solder composition has a relatively low melting point. Thus, the potential for degradation of the superconductor component is minimized.

Further, it is necessary for the solder paste 36 to include a flux, which, as is well-known in the pertinent art, gives the solder paste 36 an ability to clean surfaces prior to soldering. Further, the solder paste 36 will necessarily include a binder which is well-known in the pertinent art for holding the flux and metal solder in stable suspension and for preventing metal solder/flux interaction prior to heating. For purposes of the present invention the flux may be either an organic acid, inorganic acid or a rosin-based flux. Preferably, it is an organic acid flux whose residue is water soluble.

Figure 3:
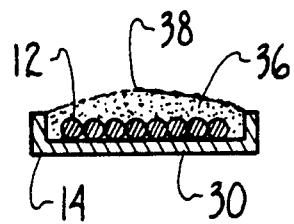
FIG. 3 is a cross-sectional view of a portion of the superconductor wire as seen along the line 3—3 in FIG. 1 during the process of fabrication.
Figure 4:
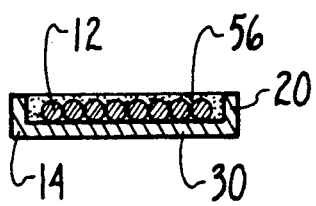
FIG. 4 is a cross-sectional view of a portion of the superconductor wire as seen along the line 4—4 in FIG. 1 during the process of fabrication.

As shown in FIG. 3, it is preferred that sufficient solder paste 36 be dispensed into groove 28 for the solder paste 36 to create a mound 38 of paste 36. This is so in order for there to be sufficient material with which to bind superconductor fibers 12 to channel 14 after the combination has been subjected to subsequent processing steps. As will be appreciated by the skilled artisan, the rate at which solder paste 36 is dispensed from dispenser 16 will depend on several variables. First, there is the speed at which channel 14 and the superconductor fibers 12 are passed under the dispenser 16. Second, the physical dimensions of the channel 14 are a consideration. And third, the extent to which mound 38 is to be created must be considered. Importantly, the dispensing of solder paste 36 into groove 28 of channel 14, as disclosed herein, is intended to provide a gentle process for surrounding or embedding the superconductor fibers 12 in the paste 36 while minimizing the potential of physical damage to the fibers 12. Indeed, it has been determined that some conventional procedures, such as the well-known procedure for wave soldering, can cause unacceptable physical damage to the extremely fragile superconductor fibers 12.

A device for dispensing solder paste 36 into groove 28 of channel 14 in accordance with the present invention is shown in FIG. 2. Specifically, the dispenser 16 is shown in cross-section and is shown to comprise three loading compartments 40a, b and c. As shown, solder paste 36 can be placed in each of the compartments 40a, b and c and the respective valves 42a, b and c appropriately opened to allow for the selective flow of paste 36 from the compartments 40a, b and c, into chute 44. A flow control valve 45 is positioned in chute 44 to control the rate of flow of solder paste 36 through chute 44 and out nozzle 46. As intended for the present invention the valves 42a, b and c and the control valve 45 are of any type well-known in the pertinent art which can be effectively used in concert to dispense solder paste 36 through the dispenser 16.

FIG. 1 indicates that after solder paste 36 has been dispensed by dispenser 16 onto superconductor fibers 12 in the groove 28 of channel 30, this combination is passed through a furnace 18. For purposes of the present invention furnace 18 can be of any type well-known in the pertinent art. Importantly, however, furnace 18 must be capable of both heating and cooling the solder paste 36 in a prescribed manner as it surrounds the superconductor fibers 12 in channel 14. Specifically, the solder paste 36 must be subjected to at least three identifiable time/temperature stages. As shown in FIG. 1, furnace 18 includes a heating chamber 47 for a first stage 48 in which the solder paste 36 is preheated to drive off the volatile components that are in solder paste 36. Also included in furnace 18 is a heating chamber 49 for the second stage 50 of the process in which the solder paste 36 is rapidly heated to first activate the flux in paste 36 and then melt the metal solder in pasge 36, which causes a separation of the liquid flux from the liquid solder 56. At this point, the solder begins to flow and wet all metal components previously cleaned by the activated flux. In accordance with the present invention, both heating chamber 47 and heating chamber 49 may be of any type heating element known in the pertinent art, such as a hot plate or an infrared lamp.

In the third stage 52 of the process for fabricating wire 20, the solder metal is initially maintained in the liquid state in heating chamber 53. A cooling chamber 51 is provided for the purpose of solidifying the liquid solder 56 that remains in the groove 28 of channel 14 after the first stage 48 and the second stage 50, and initial part of the third stage have been completed. FIG. 1 also shows that furnace 18 includes a guide 54 which is slightly curved and mounted in furnace 18 to provide a curved path along which the channel 14 must follow as it passes through the furnace 18. The purpose for this curved path is to generate a normal force on the superconductor fibers 12 to counter buoyant forces from the molten solder and restrain the fibers in the groove 28 and against or near the floor 30 of channel 14 during the fabrication process.

Figure 5:
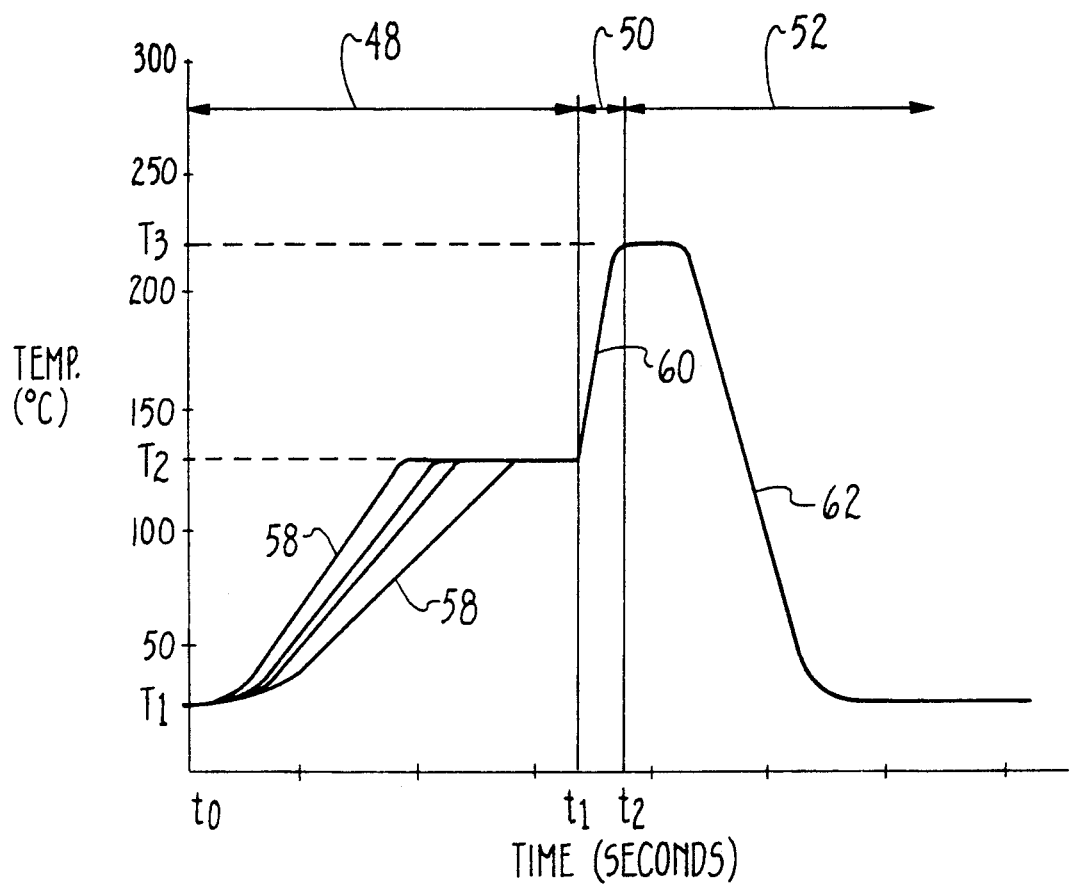
FIG. 5 is a temperature vs. time diagram of the heating stages for fabrication of a superconductor wire in accordance with the process of the present invention.

The specific heating stages which are accomplished by the apparatus 10 that eventually result in the fabrication of superconductor wire 20 are, perhaps, best appreciated with reference to FIG. 5. There it will be seen that first stage 48 begins after superconductor fibers 12 have been juxtaposed by combiner 22 and positioned to rest on the floor 30 of channel 14. Effectively, first stage 48 begins as the combination of fibers 12, channel 14 and solder paste 36 enters furnace 18. For convenience, the effect of furnace 18 on this combination of elements will be discussed with specific reference to the solder paste 36 and its reflowed and solidified solder 56. It is to be appreciated, however, that the fibers 12 and the channel 14 will also be subjected to the same time and temperature variations in each of the various stages. With this in mind, solder paste 36 enters furnace 18 at an initial time $t_0$ and an initial temperature $T_1$ (i.e. room temperature). During first stage 48, solder paste 36 is heated from room temperature ($T_1$) to a temperature $T_2$ which is below the flux activation temperature of the particular solder paste 36 and which is typically about one hundred thirty degrees centigrade (130° C.). As shown by the curves 58, the transition from $T_1$ to $T_2$ during first stage 48 can be accomplished at any of several rates. In any case, the temperature $T_2$ is held for any period of time that is necessary to remove volatile components from solder paste 36.

The duration of second stage 50 which begins at time $t_1$ can be critical. Specifically, With solder paste 36 at the temperature $T_2$, a relatively rapid rise in temperature is initiated at time $t_1$. Preferably, this rapid rise in temperature is made at a rate which is approximately equal to fifty degrees centigrade per second (50° C./sec). During this rise in temperature, the flux in solder paste 36 is activated as the solder paste 36 passes above the flux activation temperature which is typically one hundred fifty degrees centigrade (150° C.). This activation of the flux causes the flux in solder paste 36 to clean the metal components (i.e., the silver coating on superconductor fibers 12, the solder metal in solder paste 36, and the channel 14). As the temperature of the solder continues to rise during this second stage 50, the solder 56 melts and the less dense flux in solder paste 36 will rise and float on the molten solder 56. Specifically, this separation or disassociation of the flux from the solder paste 36 becomes effective at approximately one hundred eighty degrees centigrade (180° C.), the melting point of the solder.

With reference to FIG. 5, it will be appreciated that the temperature rise from $T_2$ to a temperature in the range of two hundred five to two hundred twenty degrees centigrade (205° C.–220° C.) ($T_3$), as indicated by the curve 60 is accomplished in the time interval between $t_1$ and $t_2$. Preferably, this time interval is on the order of one to ten seconds (1–10 secs.) and more preferably is around two seconds (2 secs.). Importantly, by keeping this time interval short, the activated flux is quickly removed from contact with the silver coated superconductor fibers 12, thereby minimizing the possibility that the activated flux will corrode or otherwise damage the superconductor fibers 12.

During the third stage 52, the temperature of the combination which now includes superconductor fibers 12, channel 14 and molten solder 56 is maintained for a period of approximately one to ten seconds (1-10 secs.) at $T_3$ to facilitate the flow of solder 56 around fibers 12 in channel 14. The temperature is then rapidly lowered in one to five seconds (1-5 secs.) from $T_3$ to a temperature below the melting point of the solder 56. This is important in order to minimize the time at which molten solder 56 is in contact with the superconductor fibers 12. The intent here is to consequently minimize the adverse corrosive effect that molten solder 56 would have on the fibers 12. As indicated by the curve 62 this cooling can be accomplished fairly rapidly and will eventually return the wire 20 to room temperature $T_1$. Effectively, after the completion of third stage 52 solder paste 36 has been converted to solder 56 and the flux residue (not shown) which was separated from solder paste 36 lies on top of the solder 56.

The superconductor wire 20 which emerges from furnace 18, as just indicated above, is covered with the flux residue. This flux residue must now be removed. To do this, a scrubber 64 is positioned as shown in FIG. 1. In the case where the flux residue is water soluble, scrubber 64 provides a hot water rinse to remove the flux from superconductor wire 20. Preferably, the temperature of this hot water rinse is in the range of one hundred twenty to one hundred eighty degrees Fahrenheit (120° F.-180° F.). In the case where the flux is rosin-based, scrubber 64 can be modified to provide a solvent rinse which will remove the flux residue from superconductor wire 20. The result is a superconductor wire 20, which is shown in cross section in FIG. 4. There it will be seen that wire 20 is substantially flat and has a substantially rectangular cross section. Further, it will be appreciated that the transition from solder paste 36 to solder 56 has effectively eliminated the mound 38. Importantly, the superconductor fibers 12 are completely wetted and encased or surrounded by the solder 56 to protect the superconductor fibers 12, and the solder 56 has attached to the channel 14 to hold and support the superconductor fibers 12 on the channel 14.

In addition to protecting and supporting superconductor fibers 12, the combination solder 56 and copper channel 14 also operate as a current bypass element. In other words, when the superconductor changes from the superconducting state to the normal state during operation (i.e., when the wire 20 is carrying significant electrical current), the electrical current will then flow into the solder 56 and copper channel 14. This bypass capability is intended to prevent a catastrophic destruction of the superconductor which might otherwise occur. After being washed at scrubber 64, the superconductor wire 20 is wound around take-up spool 66 for transport and subsequent use.

While the particular process for soldering superconductor fibers into a copper channel as herein shown and disclosed in detail is fully capable of obtaining the objects and providing the advantages herein before stated, it is to be understood that it is merely illustrative of the presently preferred embodiments of the invention and that no limitations are intended to the details of construction of design herein shown other than as defined in the appended claims.

We claim:

1. A process for joining superconductor fibers with a channel formed with a groove which comprises the steps of:

(a) positioning a plurality of superconductor fibers in said groove of said channel;
   (b) filling said groove with a solder paste by continuously dispensing a flowable solder paste into said groove with said solder paste having a flux constituent and a solder metal constituent to surround said superconductor fibers;
   (c) heating said solder paste to activate said flux; and
   (d) heating said solder paste to melt said solder metal and surround said superconductor fibers with said molten solder.

2. A process as recited in claim 1 further comprising the step of freezing said molten solder to encase said superconductor fibers in said solder.

3. A process as recited in claim 1 wherein said solder paste includes a SN62-Pb36-Ag2 solder.

4. A process as recited in claim 1 wherein said flux is organic acid based and has a water soluble residue.

5. A process as recited in claim 4 further comprising the step of removing said water soluble flux residue by a hot water rinse in the temperature range of one hundred twenty to one hundred eighty degrees Fahrenheit (120° F.-180° F.).

6. A process as recited in claim 1 wherein said solder paste is heated from approximately one hundred thirty degrees to approximately two hundred twenty degrees centigrade (130° C.-220° C.) in approximately two seconds (2 secs.), to activate said flux in said solder paste and to melt said solder metal in said solder paste.

7. A process as recited in claim 1 wherein said solder paste is heated prior to activation of said flux component of said solder paste to a temperature of approximately one hundred thirty degrees centigrade (130° C.).

8. A process as recited in claim 1 wherein in step d a temperature of approximately two hundred twenty degrees centigrade (220° C.) is maintained for approximately one to ten seconds (1-10 secs.).

9. A process as recited in claim 2 wherein said freezing step is accomplished by cooling to a temperature below the melting point of said molten solder during a time period of one to five seconds (1-5 secs.).

10. A process as recited in claim 1 wherein said fiber is coated with silver.

11. A process as recited in claim 1 wherein said channel is U-shaped and made of copper.

12. A process as recited in claim 1 wherein said fiber is juxtaposed with a plurality of fibers within a layer of solder paste.

13. A process as recited in claim 1 wherein the positioning step is accomplished by continuously feeding said superconductor fiber into said groove of said channel.

14. A process for joining superconductor material with a substrate which comprises the steps of:

(a) embedding said superconductor material in a solder paste having a flux constituent and a metal solder constituent;
   (b) supporting said embedded superconducting material on said substrate;
   (c) heating said solder paste to activate said flux; and
   (d) heating said solder paste to melt said solder metal constituent and surround said superconductor material with said molten solder;
   with said heating step to activate said flux and said heating step for melting of said solder metal accomplished during a time period of approximately two seconds (2 sec.).

15. A process as recited in claim 14 further comprising the step of solidifying said molten solder to encase said superconductor material in said solder.

16. A process as recited in claim 14 wherein said substrate is a U-shaped copper channel formed with a groove and said superconductor material is positioned in said groove.

17. A process as recited in claim 14 wherein said heating step for activation of said flux and said heating step for melting of said solder metal are accomplished during a relatively rapid rise in temperature from approximately one hundred thirty degrees centigrade (130° C.) to approximately two hundred twenty degrees centigrade (220° C.).

18. A process as recited in claim 14 wherein said solder paste includes Sn62-Pb36-Ag2 solder.

19. A process as recited in claim 18 wherein said flux is organic acid based and has a water soluble residue.

20. A process as recited in claim 19 further comprising the step of removing said water soluble flux residue by a hot water rinse.

21. A process for joining superconductor fibers with a substrate which comprises the steps of:
    (a) positioning a plurality of superconductor fibers on the substrate;
    (b) continuously dispensing a solder paste onto said substrate with said solder paste having a flux constituent and a solder metal constituent to surround said superconductor fibers;
    (c) heating said solder paste to activate said flux; and
    (d) heating said solder paste to melt said solder metal and surround said superconducting fibers with said molten solder.

22. A process as recited in claim 21 wherein said solder paste is heated from approximately one hundred thirty degrees to approximately two hundred twenty degrees centigrade (130° C.–220° C.) in approximately two seconds (2 sec) to activate said flux in said solder paste and to melt said solder metal in said solder paste.

23. A process as recited in claim 21 wherein said superconductor fibers as formed of a ceramic superconductor.

24. A process as recited in claim 23 wherein said ceramic superconductor is a 1-2-3 superconductor.

* * * * *